(12) United States Patent
Atherton

(10) Patent No.: US 8,058,879 B1
(45) Date of Patent: Nov. 15, 2011

(54) VOLTAGE INDICATING COUPLING FOR METAL CONDUIT SYSTEMS

(76) Inventor: John C. Atherton, Portland, OR (US)

( * ) Notice: Subject to any disclaimer, the term of this patent is extended or adjusted under 35 U.S.C. 154(b) by 415 days.

(21) Appl. No.: 12/349,314

(22) Filed: Jan. 6, 2009

(51) Int. Cl.
 *G01R 31/14* (2006.01)
(52) U.S. Cl. ......... 324/510; 439/95; 439/100; 174/68.3; 174/64; 333/12; 285/217
(58) Field of Classification Search .................... 324/510
 See application file for complete search history.

(56) References Cited

U.S. PATENT DOCUMENTS

| | | | |
|---|---|---|---|
| 3,404,335 A | 10/1968 | Kidder | |
| 3,697,896 A * | 10/1972 | Sarkozi et al. | 333/12 |
| 3,988,052 A * | 10/1976 | Mooney et al. | 439/804 |
| 4,471,294 A * | 9/1984 | Nielsen | 324/534 |
| 4,721,916 A | 1/1988 | Hanasawa | |
| 5,233,495 A * | 8/1993 | De Palma et al. | 361/3 |
| 5,404,104 A | 4/1995 | Rivola | |
| 5,466,890 A * | 11/1995 | Stagnitti | 174/84 R |
| 5,553,896 A * | 9/1996 | Woodward | 285/47 |
| 5,642,052 A | 6/1997 | Earle | |
| 5,854,556 A | 12/1998 | Steennis | |
| 6,005,518 A | 12/1999 | Kallina | |
| 6,157,184 A * | 12/2000 | Atherton | 324/133 |
| 6,198,403 B1 | 3/2001 | Dorrough | |
| 6,262,369 B1 * | 7/2001 | Marik et al. | 174/64 |
| 6,300,772 B1 | 10/2001 | Brown | |
| 6,359,442 B1 | 3/2002 | Henningson | |
| 6,459,271 B1 | 10/2002 | Vokey | |
| 6,504,382 B2 | 1/2003 | Smith | |
| 6,531,878 B1 | 3/2003 | Bystrom | |
| 6,624,622 B2 | 9/2003 | Noh | |
| 6,708,126 B2 | 3/2004 | Culler | |
| 6,762,461 B2 * | 7/2004 | Kawamoto | 257/358 |
| 6,794,879 B2 | 9/2004 | Lawson | |
| 6,850,073 B2 | 2/2005 | Elms | |
| 7,102,345 B2 | 9/2006 | Jackson | |
| 7,164,273 B2 | 1/2007 | Bailey | |
| 7,227,372 B2 | 6/2007 | Bae | |
| 7,893,686 B1 * | 2/2011 | Atherton | 324/133 |
| 2002/0016675 A1 | 2/2002 | Vail, III | |
| 2002/0024342 A1 | 2/2002 | Bussinger | |
| 2002/0140433 A1 | 10/2002 | Lawson | |
| 2003/0057956 A1 | 3/2003 | Iasso et al. | |

(Continued)

FOREIGN PATENT DOCUMENTS

JP 02082570 A * 3/1990

*Primary Examiner* — Timothy J Dole
*Assistant Examiner* — Benjamin M Baldridge
(74) *Attorney, Agent, or Firm* — Chernoff, Vilhauer, McClung & Stenzel

(57) ABSTRACT

A voltage indicating coupling for metal conduit systems to indicate the presence or absence of voltage on a wire enclosed by a section of electrical conduit for a grounded AC power distribution system. Through the use of two opposing rectifiers the National Electrical Code requirement that the entire metal conduit system be grounded is met. The voltage indicating coupling comprises a liquid crystal display (LCD), a static suppression resistor, two opposing rectifiers for grounding purposes, a plastic block housing and two clamping screws with corresponding wire terminals. At least one "hot" conductor enclosed by the section of electrical conduit is capacitively coupled to the conduit creating a complete circuit through the liquid crystal display (LCD), the static suppression resistor and the opposing rectifiers. The path around the circuit is completed by a ground connection on the grounded part of the conduit system, and the ground connection at the transformer.

9 Claims, 4 Drawing Sheets

U.S. PATENT DOCUMENTS

| | | |
|---|---|---|
| 2004/0201380 A1 | 10/2004 | Zimmermann |
| 2006/0109601 A1* | 5/2006 | Bolz ............................. 361/119 |
| 2008/0012338 A1* | 1/2008 | Wiese ........................... 285/417 |
| 2008/0042657 A1 | 2/2008 | Radle |
| 2008/0048710 A1 | 2/2008 | Cern |
| 2008/0100282 A1 | 5/2008 | Crick |
| 2008/0224710 A1 | 9/2008 | Henningson |
| 2009/0044474 A1* | 2/2009 | Condon et al. ............... 52/407.5 |

* cited by examiner

VOLTAGE INDICATING COUPLING FOR METAL CONDUIT SYSTEMS

BACKGROUND OF THE INVENTION

1. National Field of Invention

One version of the voltage indicator is intended for single-phase and three phase AC voltage detection on 90-277 volt (with respect to ground) rms wires enclosed in metal conduit as is used in grounded AC power distribution systems as is common in the United States.

2. International Field of Invention

Another version of the voltage indicator is intended for single-phase and three phase AC voltage detection on 90-277 volt (with respect to ground) rms wires enclosed in metal conduit as is used in grounded AC power distribution systems as is common outside the United States.

3. Reasons for Utility of Invention

This invention shows that voltage is present on at least one wire of possibly several that are enclosed in a section of metal conduit of various possible sizes. The electrically isolated section of conduit is grounded to the rest of the metal conduit system through two opposing rectifiers which will electrically break down if a "hot" wire grounds to this semi-grounded section of the conduit.

1. Device can be mounted anywhere during initial installation in metal conduit system where there are two or more feet of exposed metal conduit.
2. Device doesn't physically damage the enclosed wiring.
3. Circuit breaker or fuse may be tripped or blown at main panel.
4. Incandescent light bulb filament may be burned out.
5. Ground fault circuit interrupter may be tripped.
6. Receptacle may be controlled by a light switch.
7. The circuit breaker panel is at a remote location.
8. The load may be burned out or defective.
9. The load may consist of a heating or cooling device that would take several minutes to know if turned on.

SUMMARY OF THE INVENTION

In accordance with a first aspect of the invention, the invention is designed to show whether the semi-grounded conduit section is enclosing at least one "hot" conductor. When at least one enclosed conductor is "hot" the liquid crystal display (LCD) 26 shows "ON." The invention comprises a plastic coupling block 34 on which is mounted a liquid crystal display 26 that is in parallel with a static suppression resistor 22 and also in parallel with two series connected opposing rectifiers 18, 20. One of the two liquid crystal display (LCD) 26 leads is connected through a terminal lug, spring 32 and metal screw 37 to the end of a section of metal conduit. The second of the two liquid crystal display (LCD) 26 leads is connected through another terminal lug, spring 32 and metal screw 37 to the end of another section of conduit. With the use of two of these plastic couplings, a section of conduit at least two feet in length can be electrically isolated from the other sections of grounded conduit in the conduit run.

In accordance with a second aspect of the invention, the opposing rectifiers at each end of the semi-grounded section of conduit provide a path to ground in the unlikely event that a "hot" conductor should make electrical contact with the semi-grounded metal conduit section. One of the two rectifiers in this event will short out since the reverse voltage of the rectifiers is lower than the voltage applied to the "hot" conductor.

REFERENCE NUMBERS IN DRAWINGS

| | |
|---|---|
| 10 | Grounded metal conduit section (1) |
| 12 | Semi-grounded metal conduit section (1) |
| 13 | Grounded metal conduit section (1) |
| 14 | A "live" 90VAC-277VAC wire (one or more) |
| 16 | A main transformer (8,000-12,000 volt primary) (90VAC to 277VAC secondary) (1) |
| 17 | A voltage indicating coupling as an entire unit (1) |
| 18 | A low voltage rectifier (1) |
| 20 | A low voltage rectifier (1) |
| 22 | A static suppression resistor (1) |
| 26 | A two digit liquid crystal display (LCD) (1) |
| 29 | A hole for inserting a conduit end in (2) |
| 32 | A spring with a terminal lug on it (2) |
| 34 | A plastic rectangular block (1) |
| 35 | Screw mounting holes in phenolic board (2) |
| 37 | Conduit clamping and terminal metal screws (2) |
| 38 | Electrical tape spirally wrapped around (2 or more per conduit section) semi-grounded metal conduit section |
| 40 | Metal conduit strap (2 or more per conduit section) |

DETAILED DESCRIPTION

FIGS. 2A and 2B show the device in detail. A liquid crystal display 26, a static suppression resistor 22 and two opposing rectifiers 18, 20 are all connected in parallel and mounted to a phenolic circuit board. The phenolic circuit board is attached to plastic coupling block 34 by means of two machine screws 35. The plastic coupling block 34 has two different diameter round holes in it just large enough to accommodate the two conduit ends. The bore size of the middle of the plastic block 34 is slightly smaller than the outside diameter of the conduit ends so that the two ends of the conduit do not touch each other physically or electrically. Conduit clamping screws 37 provide both an electrical and mechanical connection to each conduit end. Spring 32 provides a pressing against of a terminal lug that attaches wires to liquid crystal display 26. The entire device is denoted by reference number 17.

Operations and Use FIG. 1, FIG. 3, FIG. 4A, FIG. 4B, FIG. 5, FIG. 6

FIG. 1 gives a schematic diagram of the complete circuit loop of the voltage indicating coupling when it is used in conjunction with a second voltage indicating coupling. The coupling is always intended to be used in pairs. A main transformer 16 supplies an AC voltage potential with respect to ground of 90-277 volts r.m.s. This potential goes through at least one "hot" wire 14 through the semi-grounded section of conduit 12. A person having ordinary skill in the art can understand this circuit if the person understands capacitive coupling. Capacitors pass AC while blocking DC. A capacitor is formed by the "hot" conductor 14, and the semi-grounded metal conduit section 12 with air and insulation on the conductor being the dielectric of the capacitor. This capacitive coupling energizes the liquid crystal display (LCD) 26 with grounded conduit section 13 being the return path to the main transformer 16.

The static suppression resistor 22 provides a dummy load to absorb any stray signals from energizing the liquid crystal display 26. The two opposing rectifiers 18, 20 provide a path to ground for the semi-grounded conduit in the unlikely event that a "hot" conductor should "ground out" on an inside wall of the semi-grounded conduit section. The opposing rectifiers have a lower reverse voltage rating than the voltage supplied by the "grounded out" "hot" conductor which means that the reversed rectifier of the pair will be shorted closed permanently. This means that the circuit breaker or fuse will be tripped that protects the "grounded out" "hot" conductor. In order for the semi-grounded conduit section to be operable again as a voltage indicator, the "grounded out" conductor will need to be replaced along with the phenolic circuit board assembly on the voltage indicating coupling that has the shorted out rectifier 18, 20.

Figure 1:
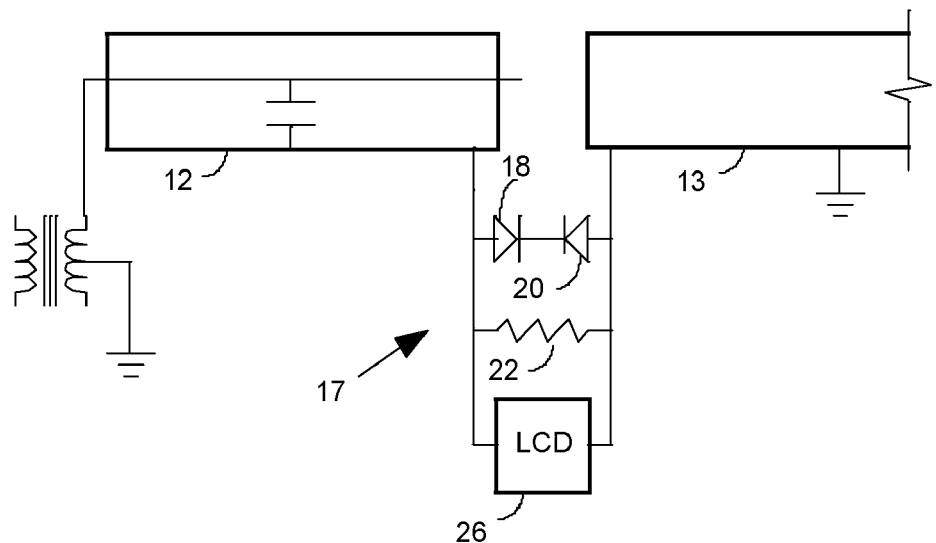
Figures 2A, 2B:
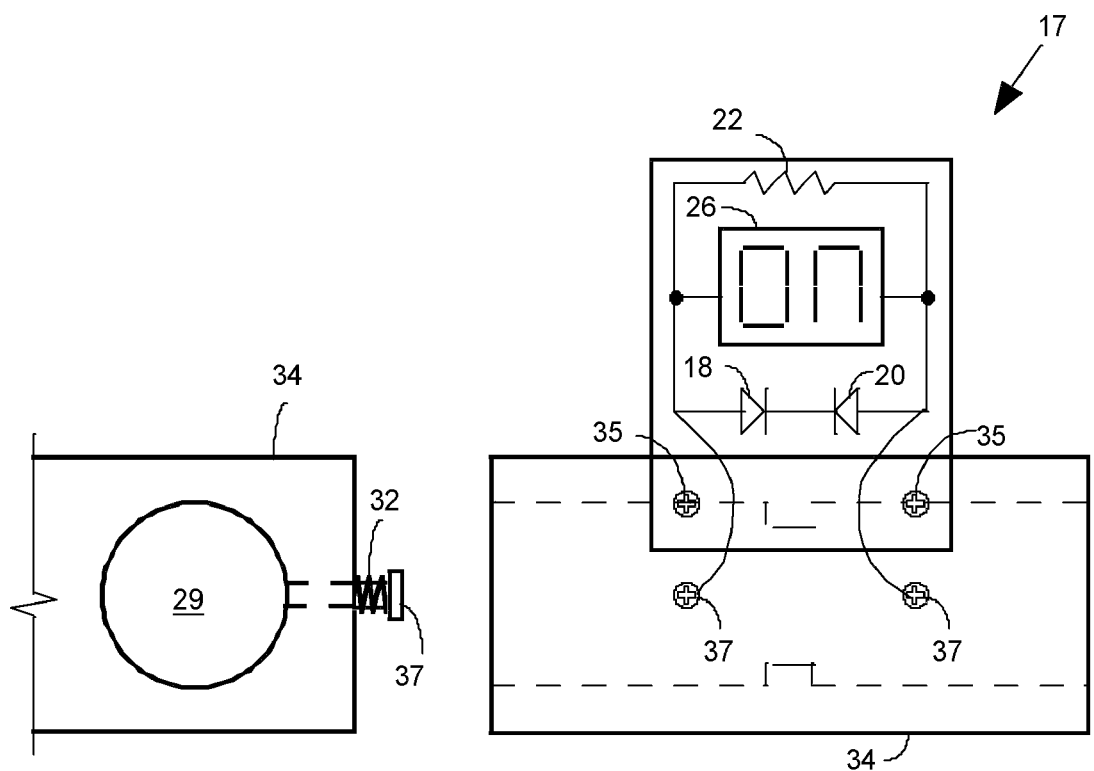
Figure 3:
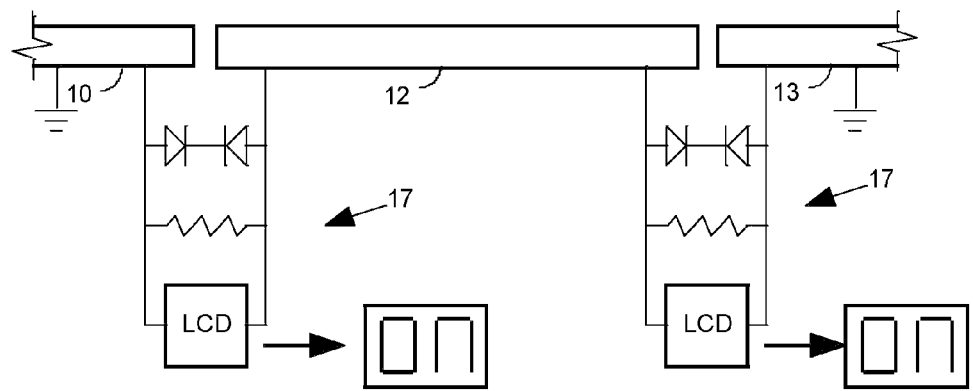
FIG. 3 shows a semi-grounded section of conduit 12 that is not directly connected to conduit sections 10 or 13. The "on" display is shown as if at least one of the wires enclosed in the semi-grounded section of conduit is "hot."
Figure 4A:
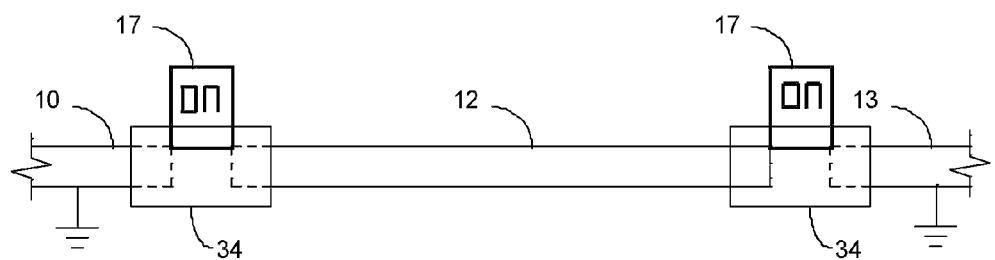
FIG. 4A shows two voltage indicating couplings making for a semi-grounded conduit section 12. In this figure since the "on" display is energized, at least one of the enclosed wires is "hot."
Figure 4B:
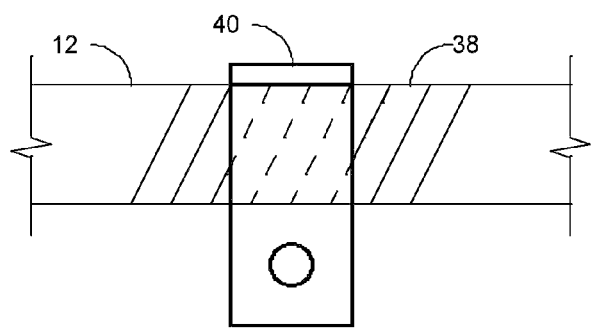

FIG. 4B shows how to keep the semi-grounded conduit section 12 from being fully grounded when using conduit mounting straps 40. A layer of electrical tape 38 is spirally wrapped over the conduit 12 at the point of the metal conduit strap 40.

Figure 5:
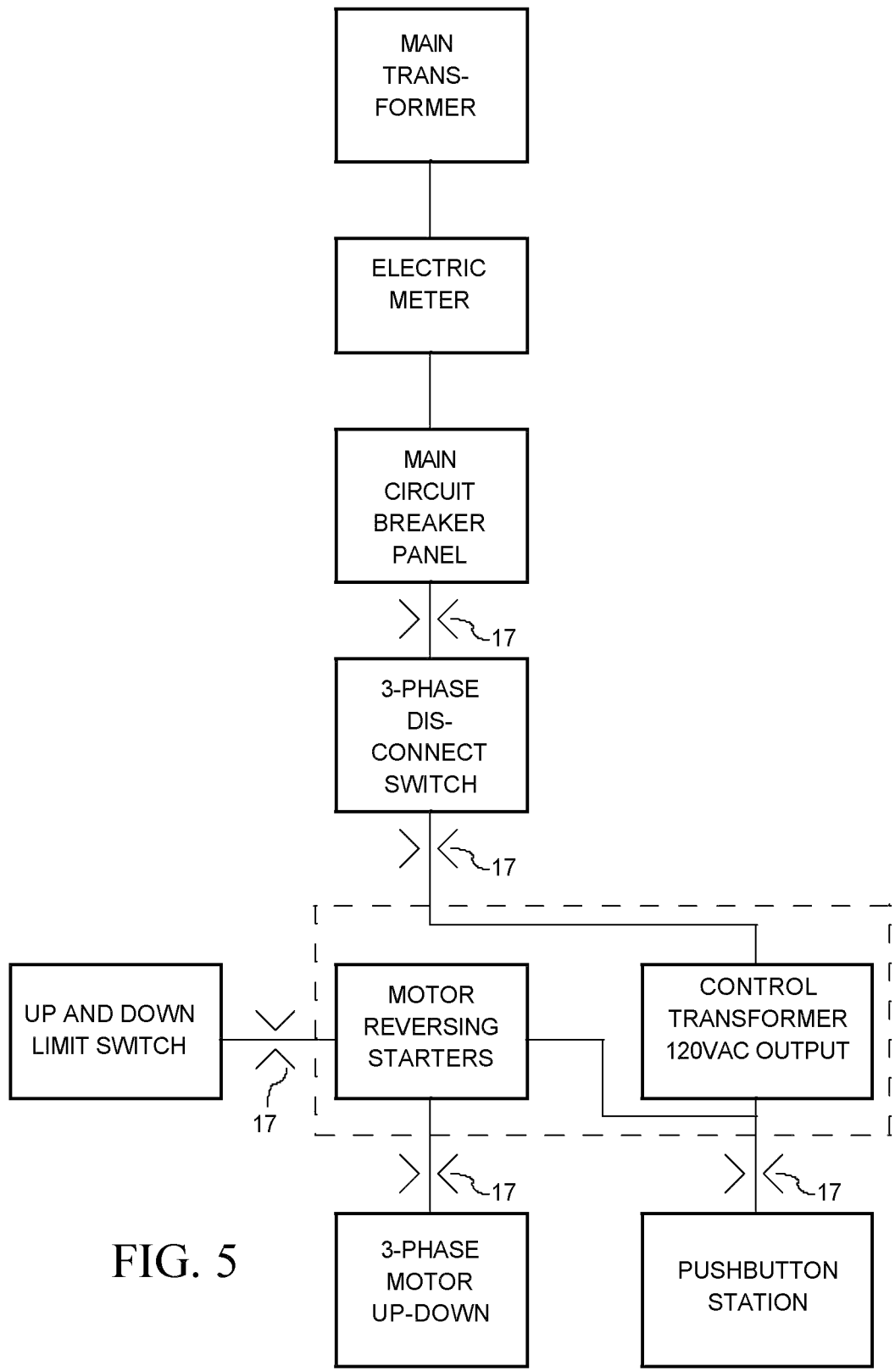

FIG. 5 shows a block diagram for an overhead door circuit. In the diagram the individual links between each block represent actual runs of metal conduit with 17 indicating where a pair of voltage indicating couplings could possibly be installed. In the preferred usage of the invention each section of semi-grounded conduit represents a section of metal conduit two feet in length.

Figure 6:
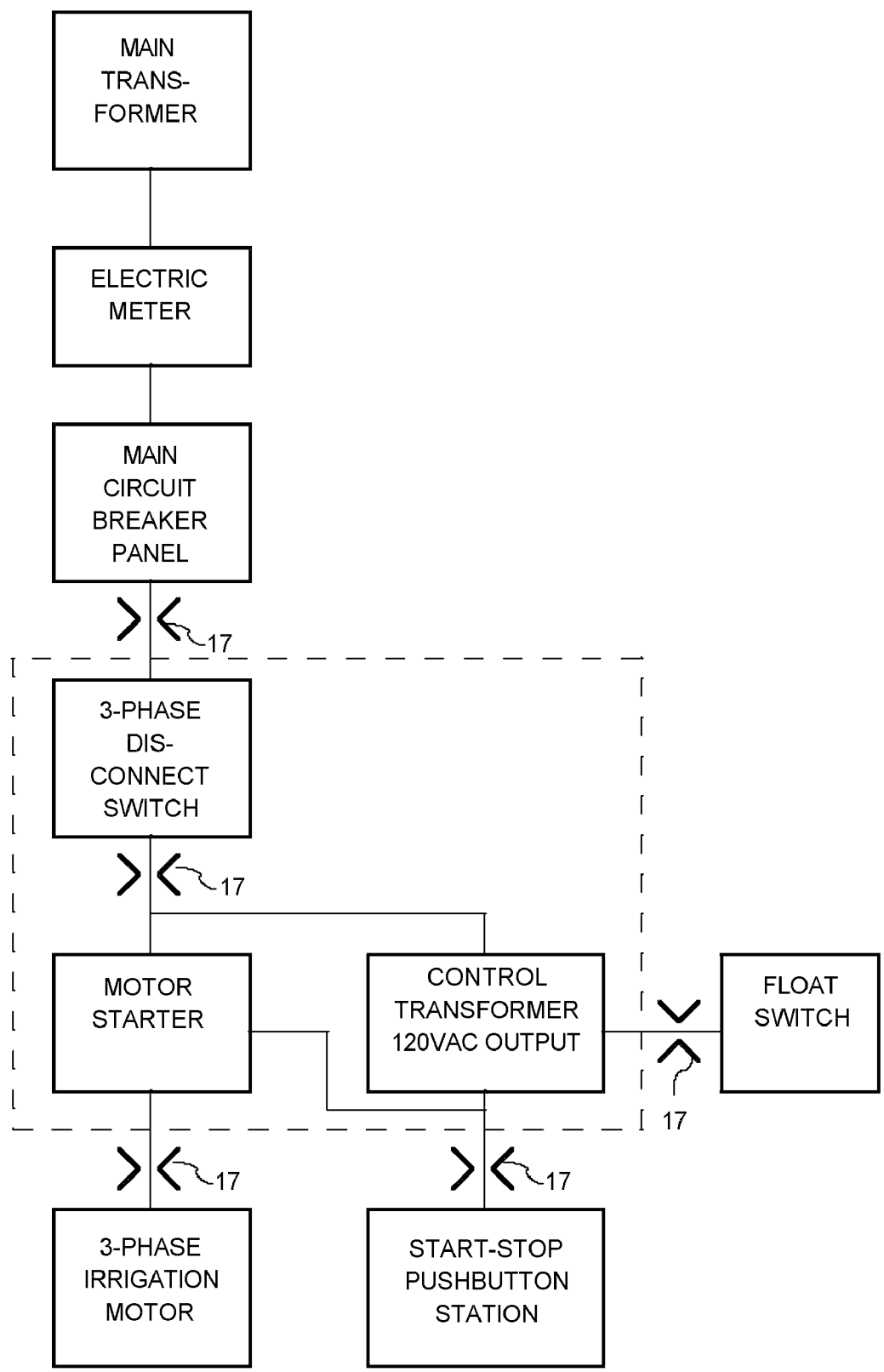

FIG. 6 shows a block diagram for an irrigation pump in a field as a second usage example of the voltage indicating couplings.

SUMMARY, RAMIFICATIONS AND SCOPE

Accordingly, the reader will see that the national and international versions of the voltage indicating coupling for metal conduit systems of this patent application provides a convenient and inherently simple method for the determination of at least one AC potential on wiring enclosed by the semi-grounded conduit. A summary of the reasons for the usefulness of this invention was included in the "Reasons for Utility of the Invention" section.

Possible ramifications of this invention include but are not limited to making the couplings in the form of type C condulets to be placed in the conduit system. The coupling could be made out of many types of insulating materials. Although the description above contains certain specificities, these should not be construed as limiting the scope of the invention but as merely providing illustrations of the currently preferred embodiment.

The invention claimed is:

1. A coupling for mounting in a metal conduit system for indicating the presence or absence of AC voltage on an insulated conductor enclosed by a first, ungrounded section of the metal conduit system, said coupling comprising:
    a body of electrically insulating material for location between and in mechanical engagement with both the first section of the metal conduit system and a second, grounded section of the metal conduit system, whereby the body of electrically insulating material does not provide electrical connection between the first section of the metal conduit system and the second section of the metal conduit system, and
    a status indicating means attached to and supported by the body of electrically insulating material, the status indicating means comprising a high impedance display device having at least first and second display electrodes for connection to the first section and the second section respectively of the metal conduit system, a static suppression resistor connected between the first and second display electrodes, and two opposing unidirectionally conductive devices connected in series opposition between the first and second display electrodes, each unidirectionally conductive device having a reverse breakdown voltage that is less than a nominal voltage relative to ground of the insulated conductor,
    whereby in normal operation and use the presence or absence of voltage on the insulated conductor is indicated by the appearance of said display device and in the event that the conductor is shorted to the first section of the metal conduit system and the conductor is at a voltage relative to ground at least as high as said nominal voltage the unidirectionally conductive devices ground the first section to the second section.

2. A coupling according to claim 1, wherein the high impedance display device is a liquid crystal display device.

3. A coupling according to claim 1, wherein the two unidirectionally conductive devices are diodes having their cathodes connected together and their anodes connected to the first and second display electrodes respectively.

4. A electrical power distribution system comprising:
    a first section of metal conduit,
    a second section of metal conduit,
    an insulated conductor extending through both the first section and the second section of metal conduit,
    a body of electrically insulating material located between and in mechanical engagement with both the first section of metal conduit and the second section of metal conduit, whereby the body of electrically insulating material does not provide electrical connection between the first section and the second section, and
    a status indicating means attached to and supported by the body of electrically insulating material, the status indicating means comprising a high impedance display device having at least first and second display electrodes connected to the first section and the second section respectively, a static suppression resistor connected between the first and second display electrodes, and two opposing unidirectionally conductive devices connected in series opposition between the first and second display electrodes, each unidirectionally conductive device having a reverse breakdown voltage that is less than a nominal voltage relative to ground of the insulated conductor,
    whereby in normal operation and use the first section of metal conduit is grounded, the second section of metal conduit is ungrounded, and the presence or absence of voltage on the insulated conductor is indicated by the appearance of said display device and in the event that the conductor is at a voltage relative to ground at least as high as said nominal voltage and the conductor is shorted to the second section of metal conduit, the unidirectionally conductive devices ground the second section to the first section.

5. A power distribution system according to claim 4, wherein the high impedance display device is a liquid crystal display device.

6. A power distribution system according to claim 4, wherein the two unidirectionally conductive devices are diodes having their cathodes connected together and their anodes connected to the first and second display electrodes respectively.

7. A electrical power distribution system comprising:
- a first, ungrounded section of metal conduit,
- a second, grounded section of metal conduit,
- an insulated conductor extending through both the first section and the second section of metal conduit and at a voltage relative to ground at least as high as a nominal voltage,
- a body of electrically insulating material located between and in mechanical engagement with both the first section of metal conduit and the second section of metal conduit, whereby the body of electrically insulating material does not provide electrical connection between the first section and the second section, and
- a status indicating means attached to and supported by the body of electrically insulating material, the status indicating means comprising a high impedance display device having at least first and second display electrodes connected to the first section and the second section respectively, a static suppression resistor connected between the first and second display electrodes, and two opposing unidirectionally conductive devices connected in series opposition between the first and second display electrodes, each unidirectionally conductive device having a reverse breakdown voltage that is less than said nominal voltage,
- whereby in normal operation and use the presence or absence of voltage on the insulated conductor is indicated by the appearance of said display device and in the event that the conductor is at a voltage relative to ground at least as high as said nominal voltage, and the conductor is shorted to the first section of metal conduit, the unidirectionally conductive devices ground the first section to the second section.

8. A power distribution system according to claim 7, wherein the high impedance display device is a liquid crystal display device.

9. A power distribution system according to claim 8, wherein the two unidirectionally conductive devices are diodes having their cathodes connected together and their anodes connected to the first and second display electrodes respectively.

* * * * *